United States Patent [19]

Carroll et al.

[11] Patent Number: 4,886,699
[45] Date of Patent: Dec. 12, 1989

[54] GLASS FIBER REINFORCED FLUOROPOLYMERIC CIRCUIT LAMINATE

[75] Inventors: James R. Carroll, Tempe; Leon W. McGinnis, Mesa; Terry L. Miller, Gilbert; Michael B. Norris, Chandler, all of Ariz.

[73] Assignee: Rogers Corporation, Rogers, Conn.

[21] Appl. No.: 113,533

[22] Filed: Oct. 26, 1987

[51] Int. Cl.⁴ .................. B32B 17/02; B32B 27/00
[52] U.S. Cl. ................................ 428/228; 428/209; 428/220; 428/239; 428/241; 428/245; 428/246; 428/256; 428/263; 428/251; 428/325; 428/327; 428/332; 428/421; 428/422; 428/901; 174/68.5
[58] Field of Search ............ 174/68.5; 428/901, 224, 428/228, 241, 406, 251, 212, 422, 209, 213, 220, 239, 421, 245, 246, 247, 256, 262, 263, 268, 325, 327, 332, 337, 339

[56] References Cited

U.S. PATENT DOCUMENTS 3,136,680  6/1969  Hochberg ........................ 428/251
3,617,613  11/1971  Benzinger et al. ................ 428/251
4,610,918  9/1986  Effenberger et al. ............. 428/251
4,749,610  6/1988  Katsuragawa et al. ........... 428/422

Primary Examiner—Thurman K. Page
Assistant Examiner—Donald J. Loney
Attorney, Agent, or Firm—Fishman, Dionne & Cantor

[57] ABSTRACT

A fluoropolymeric circuit laminate consisting of one or more layers of fluoropolymer impregnated woven glass cloth sandwiched between one or more layers of "random" microfiberglass reinforced fluoropolymer is presented. This composite of fluoropolymer, woven glass fabric and random glass microfibers may be clad on one or both outer surfaces with a suitable conductive material such as copper or certain known resistive foils. The fluoropolymer impregnated woven glass layer or layers will be nested between microfiberglass reinforced fluoropolymer layers to provide the outer surfaces of the circuit with smooth surfaces for fine line circuitry. The circuit laminate of the present invention exhibits good dimensional stability, smooth surfaces for fine line circuitry, good electrical properties, and strong foil and interlaminar adhesion properties.

44 Claims, 1 Drawing Sheet

GLASS FIBER REINFORCED FLUOROPOLYMERIC CIRCUIT LAMINATE

BACKGROUND OF THE INVENTION

This invention relates to laminated circuit materials. More particularly, this invention relates to fluoropolymeric glass reinforced circuit materials having excellent dimensional stability, electrical properties and a smooth surface. This circuit material is particularly well suited for applications requiring microwave operating frequencies.

Most common printed wiring board materials undergo dimensional changes during processing. These changes are induced by stress relaxation as metal claddings are removed and/or by absorption with processing solutions, and/or by temperature, pressure or humidity excursions. The addition of reinforcing fibers to polymer systems is intended, in part, to reduce the dimensional changes that occur during processing.

With respect to glass reinforced fluoropolymer boards, particularly boards composed of polytetrafluoroethylene (PTFE), there have been three common prior art types.

TYPE 1

The first type contemplates the use of a homogeneous dielectric layer of random microfiber glass reinforced PTFE. This approach produces a laminate with superior electrical performance, primarily because of the low weight percent of glass present. These random microfiberglass reinforced PTFE materials have smooth surfaces for the production of fine line circuitry needed in microwave applications. However, of the three common PTFE laminate types, it has the largest dimensional change upon processing. It will be appreciated that the lack of dimensional stability is a significant drawback as there are many well known problems associated with poor dimensional stability. One particularly troublesome problem involves the necessity for a double etching procedure. Such a procedure involves creation of two sets of artwork, the initial set processing geometries larger than that desired. After photoimaging and etching, much of the dimensional change will be realized. The final artwork is then photoimaged and etched. It will be appreciated that this double etching procedure leads to significantly higher cost due to additional labor, materials (e.g. photoimagable photoresists, etching solution), artwork costs and associated handling damage. Random glass fiber reinforced circuit boards of this type have a dielectric constant of 2.20 to 2.33, are well known in the art by the designations GR and GP; and are specified to military designation MIL-P-139494/7E.

TYPE 2

The second type of circuit material involves the use of PTFE impregnated woven glass cloths and produces a laminate exhibiting a higher dissipation factor than that described in the first type. Such laminates typically possess better dimensional stability than those described above principally because of the pressure of continuous glass fibers (rather than short, discontinuous microfibers). These materials have a dielectric constant of 2.4 to 2.6 and are known in the art by the designation GX and GT. GX and GT materials are specified in MIL-P-13949/14A.

TYPE 3

The third type of fluoropolymer circuit materials comprise composites consisting of alternating layers of unreinforced PTFE (i.e., no glass filler) and PTFE impregnated woven glass cloth. This third type offers low dielectric constant, dissipation factor, and improved dimensional stability relative to type GR materials. However, because of the presence of unreinforced layers of PTFE, the laminate suffers from poor foil adhesion and interlaminar or interstitial delamination problems. Such laminates also do not withstand thermal cycling, thermal stress or molten solder temperatures without significant bond degradation. Because of the poor foil adhesion, cooper peel strength drops substantially after temperature excursions such as those associated with multilayer bonding or temperature cycling. These laminates also suffer from significant changes in z-axis dielectric constant because of the stratified construction. These laminates have dielectric contents of about 2.17 and are designated as MIL-P-13949/14A type GY.

While all of the above discussed types of fluoropolymeric circuit materials include certain advantageous and desirable features, each also suffers from certain limitations and drawbacks. Unfortunately, there is presently no one glass reinforced fluoropolymeric circuit material which combines the best features of the known materials (e.g., good dimensional stability, good electrical properties and smooth surfaces for fine line production) without some of problems associated with these prior art materials.

SUMMARY OF THE INVENTION

The above-discussed and other deficiencies and drawbacks of the prior art are overcome or alleviated by the fluoropolymeric circuit laminate of the present invention. In accordance with the present invention, a circuit laminate is provided which is composed of one or more layers of fluoropolymer impregnated woven glass cloth sandwiched between one or more layers of "random" microfiberglass reinforced fluoropolymer. This composite of fluoropolymer, woven glass fabric and random glass microfibers may be clad on one or both outer surfaces with a suitable conductive material such as copper or certain known resistive foils. The fluoropolymer impregnated woven glass layer or layers will be nested between microfiberglass reinforced fluoropolymer layers to provide the outer surfaces of the circuit with smooth surfaces for fine line circuitry.

The circuit laminate of the present invention combines all of the best qualities of known fluoropolymer circuit materials without any of the various disadvantages. For example, the present invention exhibits good dimensional stability (like GX, GT and GY), smooth surfaces for fine line circuitry (like GR, GP), good electrical properties (like GR, GP, GY) and strong foil and interlaminar adhesion properties (unlike GY).

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several figures.

DESCRIPTION OF THE PREFERRED EMBODIMENT

Figure 1:
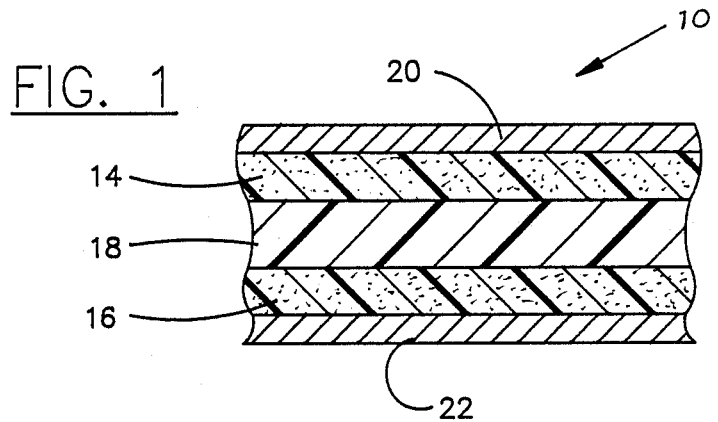
FIG. 1 is a cross sectional elevation view of a circuit laminate in accordance with the present invention.

Referring first to FIG. 1, a fluoropolymer composite circuit laminate in accordance with the present invention is identified at 10. Generally, the dielectric substrate 12 of circuit laminate 10 comprises glass microfiber reinforced fluoropolymer layers interleaved with at least one layer of fluoropolymer impregnated oven glass cloth. The total dielectric thickness will preferably range from 0.003 inch to 0.500 inch. In the particular embodiment of the present invention depicted in FIG. 1, a relatively simple dielectric construction is shown including a pair of microglass fiber reinforced fluoropolymer layers 14 and 16 sandwiching therebetween a layer 18 of fluoropolymer impregnated woven glass cloth. However, it will be appreciated that layers 14, 16 and 18 may be comprised of multiple layers or plys of the respective glass/fluoropolymer composites.

The dielectric substrate 12 includes one or two conductive layers on its opposed outer surfaces. In the FIG. 1 embodiment, two conductive layers 20 and 22 are provided on the exposed surfaces of dielectric layers 14 and 16. Conductive layers 20 and 22 may be comprised of a suitable conductive metal such as copper. Alternatively, the conductive layers may include portions of know resistive foils such as the type disclosed in U.S. Pat. No. 3,808,576, which is incorporated herein by reference; and which is commercially available under the trademark "Ohmega-Ply Foil".

The fluoropolymeric material used in both the microfiber glass and woven glass layers 14, 16 and 18 is preferably polytetrafluoroethylene (PTFE). However, other fluoropolymeric materials could also be used including, but not limited to, a copolymer of tetrafluoroethylene and perfluoroalkyl vinyl ether (PFA), a copolymer of hexafluoropropylene and tetrafluoroethylene (FEP) and a copolymer of tetrafluoroethylene and ethylene (Tefzel).

Preferably, the length, diameter and percentage of glass fibers (which may consist of commercially available E-glass) in the homogeneously and randomly dispersed microfiber glass reinforced fluoropolymer layers (e.g. layers 14 and 16) will vary within the following ranges:

Length: Less than 5000 micrometers
Diameter: 0.3 to 0.7 micrometers
Weight Percent: 2% to 25%

Preferably, the fluoropolymer impregnated woven glass cloth layer (e.g. layer 18) will consist of a suitable commercially available weave of E-glass with weight percent of fluoropolymer of between about 30% to about 85%. These weaves may include, in addition to style 1080, styles 108, 106, 112 and similar styles. All of the style numbers are common industry designations.

As mentioned, the structure of the laminate of the present invention consists of one or more layers of fluoropolymer impregnated woven glass cloth separated by one or more layers of random microfiber reinforced fluoropolymer. The fluoropolymer impregnated woven glass cloth will preferably comprise from about 10% to 60% of the overall laminate thickness, exclusive of claddings.

Figure 2:
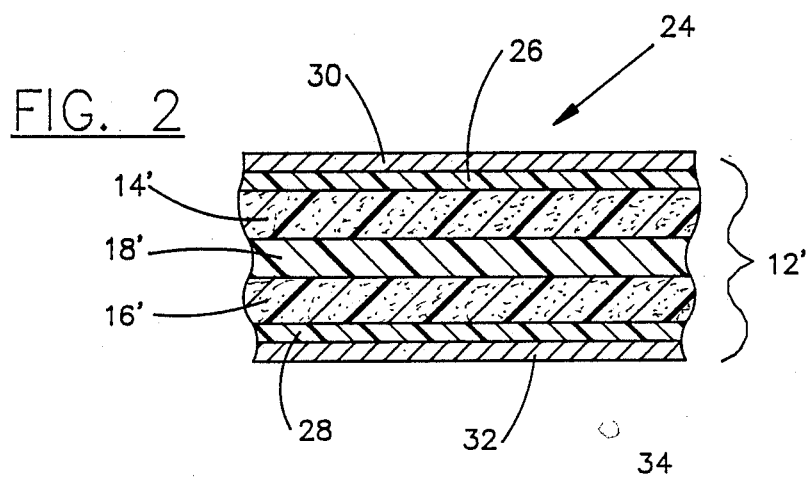
FIG. 2 is a cross sectional elevation view of another circuit laminate in accordance with the present invention.

In FIG. 2, a more complex embodiment of the present invention is shown generally at 24. Circuit laminate 24 comprises a similar dielectric substrate 12', but additionally includes upper and lower fluoropolymeric (e.g. PTFE) bonding layers 26 and 28 on glass reinforced fluoropolymeric layers 14' and 16', respectively. These bonding films 26, 28 are quite thin (e.g., 0.001 inch thick) and are used to improve the adhesion with the metal cladding. The embodiment of FIG. 2 further includes an upper outer layer 30 comprising a known resistive foil which consists of a resistive layer plated onto a copper foil; and a lower outer layer 32 comprising a suitable conductive foil such as copper. The structure of circuit laminate 24 is discussed in more detail hereinafter with regard to Example 1.

Figure 3:
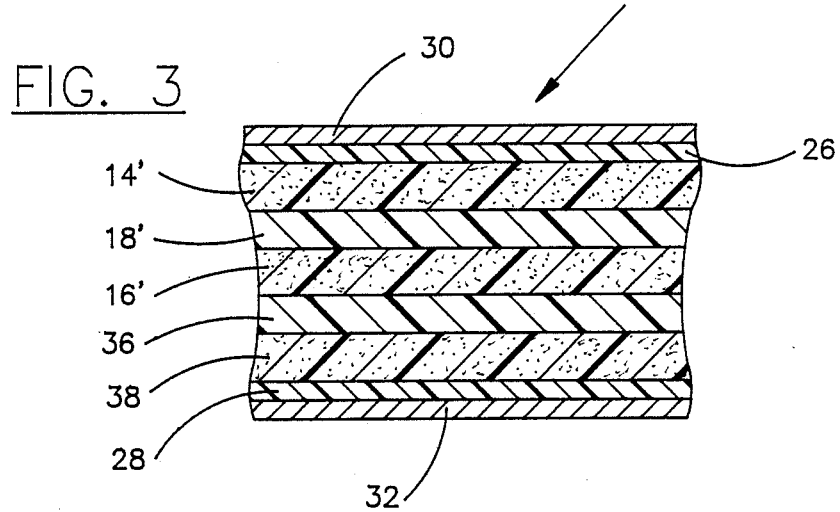
FIG. 3 is a cross sectional elevation view of still another circuit laminate in accordance with the present invention.

Still another embodiment of the present invention is shown generally at 34 in FIG. 3. Circuit laminate 34 is substantially similar to circuit laminate 24 of FIG. 2. The only difference between the circuits is that laminate 34 includes an additional layer 36 of fluoropolymer impregnated woven glass and an additional layer 38 of microglass reinforced fluoropolymer. Note that woven glass layer 36 is sandwiched between random microglass layers 16' and 38. FIG. 3 will be discussed in more detail with regard to Examples 6, 7, 12, and 13.

The following are non-limiting examples of the circuit laminate of the present invention:

EXAMPLE 1

The circuit laminate used for the first example has an overall construction as shown in FIG. 2. The following is a detailed description of each of the layers in the laminate composite with reference to the identifying numerals of FIG. 2.

The microglass reinforced layers 14' and 16' are RT/duroid 5880, a commercially available material manufactured by Rogers Corporation, assignee of the present application. RT/duroid 5880 is a glass microfiber reinforced PTFE composite having a random homogeneous dispersion of glass microfibers within the ranges described hereinabove. In the construction described above, the microglass reinforced layers 14' and 16' comprise a total of 0.15 inch of the 0.20 inch of dielectric, or 0.075 inch per side.

The woven glass layer 18' is polytetrafluoroethylene (PTFE) coated commercially available woven glass fabric. The glass reinforcement is a woven glass fabric comprised of E-glass woven in style 1080 (a common industry designation). The PTFE comprised 76% of the weight of the PTFE coated woven glass fabric, the remaining portion is the E-glass. In the above construction, the PTFE impregnated, woven glass comprises 0.003 inch of the 0.020 inch total thickness.

The PTFE bonding films 26 and 28 are commercially available skived or cast PTFE films 0.001 inch thick. These films are 100% PTFE (no glass, or other, reinforcements). These films improve mechanical adhesion of metal claddings because of their lower melt viscosity. In the construction described above, the films account for a total of 0.002 inch (two pieces of 0.001 inch film) out of a total dielectric thickness of 0.020 inch.

Resistive layer 30 is Ohmega foil, a commercially available resistive foil available from Ohmega Technologies. The foil consists of a resistive layer plated onto a copper foil.

Conductive layer 32 is a copper foil which is a commercially available electrodeposited foil meeting IPC specification #IPC-CF-150E. Foil weight is one (1) ounce (nominal thickness 0.0014 inch).

In Table 1, a data summary for the circuit laminate of Example 1 is set forth for three different lots (A-C). This data is compared to the same properties of a standard microfiber glass reinforced circuit (RT/duroid 5880). As is clear from Table 1, the circuit laminate of the present invention has a low dielectric constant (2.222 to 2.229) and excellent dimensional stability, especially when compared to prior art type GR materials (E.g. RT/duroid 5880).

ample 1). Laminates with total dielectric thickness of 0.010" through 0.062" have been evaluated. The amount of microglass reinforced dielectric (item 12' in FIG. 2) used in these laminates varied from 0.006" (in the case of the 0.10" laminate), to 0.055" (in the case of the 0.062") laminate. See the attached Table 2 for detailed information on the compositional percentages of each component.

The PTFE bonding films 26 and 28 used in these laminates were as described above, but varied in thickness from 0.0005" to 0.002". See the attached Table 2 for more detail.

The PTFE coated woven glass fabric 18' used in

TABLE 1

|  | Present Invention Example 1(A) | Present Invention Example 1(B) | Present Invention Example 1(C) | RT/Duroid 5880 |
|---|---|---|---|---|
| MilP DK | 2.225 | 2.222 | 2.229 | 2.185 |
| MilP DF | 0.00101 | 0.00105 | 0.00104 | 0.00109 |
| Sp G | 2.213 | 2.211 | 2.207 | 2.206 |
| Thickness | 0.0200 | 0.0199 | 0.0209 | 0.0199 |
| Peel Strength Solder | 11.13 | 11.54 | 10.98 | 11.24 |
| Dimensional[1] Stability (Mils/Inch) | | | | |
| MD | −0.1239 | −0.1198 | −0.1574 | −0.9185 |
| CMD | −0.6198 | −0.6867 | −0.5034 | −3.7169 |
| Tensile Strength | | | | |
| MD | 7426.70 | 7738.90 | 7966.50 | 5178.53 |
| CMD | 6934.19 | 6753.22 | 7381.25 | 4431.87 |
| Elongation | | | | |
| MD | 5.75 | 6.00 | 6.00 | 15.50 |
| CMD | 6.75 | 7.00 | 7.25 | 25.00 |

[1]Measured at room temperature after Cu removed @ ½ hr @ 170° C.

EXAMPLES 2-13

In the following examples, the same overall structure of FIG. 2 has been used, however certain variations and changes in material percentages and compositions have been made. The changes are as follows:

The microglass layers 14', 16' of the laminate is RT/duroid 5870 commercially available from Rogers Corporation (rather than RT/duroid 5880 used in Example 1).

these laminations was identical to that used for the laminations described above in Example 1.

In addition to the evaluations of the above-noted structures, a composite based on the laminate depicted in FIG. 3 was also evaluated. Reference should be made to Table 2 for a detailed analysis of the composition of the FIG. 3 laminates which correspond to Examples 6, 7, 12 and 13.

TABLE 2

| EXAMPLE | THICKNESS | MICROGLASS TYPE | TOTAL THK MICROGLASS[1] | # PLY WOVEN GLASS FIBER[2] | TOTAL THK PTFE BONDING FILM[3] |
|---|---|---|---|---|---|
| 2 | .010" | 5880 | .006" | 1 | .001" |
| 3 | .020" | 5880 | .015" | 1 | .002" |
| 4 | .031" | 5880 | .026" | 1 | .002" |
| 5 | .062" | 5880 | .055" | 1 | .004" |
| 6 | .031" | 5880 | .023" | 2 | .002" |
| 7 | .062" | 5880 | .052" | 2 | .004" |
| 8 | .010" | 5870 | .006" | 1 | .001" |
| 9 | .020" | 5870 | .015" | 1 | .002" |
| 10 | .031" | 5870 | .026" | 1 | .002" |
| 11 | .062" | 5870 | .055" | 1 | .004" |
| 12 | .031" | 5870 | .023 | 2 | .002" |
| 13 | .062" | 5870 | .052 | 2 | .004" |

[1]In the cases of laminates produced with 1 ply of woven glass fabric (FIG. 2), the total thickness of microglass reinforced dielectric is split two ways. In the case where two plys of woven glass fabric are used (FIG. 3), the microglass reinforced dielectric material is split 3 ways.
[2]All plys of woven glass are .003"; however, this may vary with other fabric styles.
[3]One ply of film is always used on each side, thus each ply is ½ of the total thickness shown below.

TABLE 3

| EXAMPLE | 2 | 3 | 4 | 5 | 6 | 7 | 8 | 9 | 10 | 11 | 12 | 13 |
|---|---|---|---|---|---|---|---|---|---|---|---|---|
| MilP DK | 2.262 | 2.233 | 2.225 | 2.213 | 2.249 | 2.221 | 2.347 | 2.356 | 2.355 | 2.342 | 2.361 | 2.350 |
| MilP DF | .00120 | .00101 | .00103 | .00092 | .00109 | .00092 | .00154 | .00172 | .00160 | .00144 | .00156 | .00151 |
| Sp G | 2.190 | 2.204 | 2.186 | 2.193 | — | — | 2.207 | 2.196 | 2.203 | 2.195 | 2.204 | 2.199 |
| Thickness | .0098" | .0188" | .0299" | .0615" | .0298" | .0615" | .0096" | .0192" | .0304" | .0619" | .0302" | .0618" |
| Peel Strength Solder lbs/in | 15.7 | 11.6 | 13.8 | 11.9 | 15.3 | 12.8 | 18.3 | 19.8 | 18.4 | 15.4 | 20.5 | 12.6 |
| Dimensional[1] | | | | | | | | | | | | |

TABLE 3-continued

| EXAMPLE | 2 | 3 | 4 | 5 | 6 | 7 | 8 | 9 | 10 | 11 | 12 | 13 |
|---|---|---|---|---|---|---|---|---|---|---|---|---|
| Stability | | | | | | | | | | | | |
| MD | .4571 | −.0811 | −.2337 | −.4910 | .1023 | −.3141 | .6422 | .2129 | .2778 | .1345 | .3238 | .2130 |
| CMD | .1145 | −.7265 | −1.0727 | −1.6563 | −.1811 | −.8538 | .4010 | −.0133 | −.1515 | −.1162 | .2643 | −.0128 |

[1] Units are in mils (.001") per inch. After complete copper removal and two ½ hr. 170° C. stress relieving bakes.

The electrical and mechanical properties of Examples 2–13 are set forth in Table 3 and are in accordance with the results set forth in Table 1.

As is clear from a review of the foregoing results, the circuit laminate of the present invention provides all of the advantages of the prior art fluoropolymeric materials discussed above in the Background section (e.g. improved dimensional stability, smooth surface for fine lines, good electrical properties including low dielectric constant, low dissipation factor and good surface isotropy) without any of the various deficiencies and drawbacks of these prior materials. Moreover, the circuit laminate of the present invention may, in some instances, preclude the necessity for double etching procedures because of its improved dimensional stability. The circuit laminate of the present invention also exhibit strong foil and interlaminer adhesion properties.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A circuit substrate laminate for microwave frequency applications consisting essentially of:
    at least one first layer of a fluoropolymer impregnated woven glass cloth having opposed first and second surfaces;
    at least one second layer of a random microglass reinforced fluoropolymer on said first surface of said first layer of fluoropolymer impregnated woven glass cloth; and
    at least one third layer of a random microglass reinforced fluoropolymer on said second surface of said first layer of fluoropolymer impregnated woven glass cloth;
    said second and third layers of random microglass reinforced fluoropolymer providing smooth outer surfaces to said circuit substrate laminate; and
    wherein said fluoropolymer is at least one of the fluoropolymers selected from the group consisting of polytetrafluoroethylene and a copolymer of tetrafluoroethylene and perfluoroakyl vinyl ether.

2. A circuit laminate for microwave frequency applications consisting essentially of:
    at least one first layer of a fluoropolymer impregnated woven glass cloth having opposed first and second surfaces;
    at least one second layer of a random microglass reinforced fluoropolymer on said first surface of said first layer of fluoropolymer impregnated woven glass cloth;
    at least one third layer of a random microglass reinforced fluoropolymer on said second surface of said first layer of fluoropolymer impregnated woven glass cloth wherein each of said second and third microglass reinforced fluoropolymer layers includes a smooth outer surface opposite said at least one layer of fluoropolymer impregnated woven glass cloth; and
    conductive material on at least a portion of at least one of said smooth outer surfaces of said second and third layers of microglass reinforced fluoropolymer; and
    wherein said fluoropolymer is at least one of the fluoropolymers selected from the group consisting of polytetrafluoroethylene and a copolymer of tetrafluoroethylene and perfluoroakyl vinyl ether.

3. A circuit substrate laminate for microwave frequency applications consisting essentially of:
    a core of one or more layers of fluoropolymer impregnated woven glass cloth having opposed first and second surfaces;
    one or more layers of a random microglass reinforced fluoropolymer adhered to said first surface of said core;
    one or more layers of a random microglass reinforced fluoropolymer adhered to said second surface of said core; and
    said layers of random microglass reinforced fluoropolymer providing smooth outer surfaces to said circuit substrate laminate; and
    wherein said fluoropolymer is at least one of the fluoropolymers selected from the group consisting of polytetrafluoroethylene and a copolymer of tetrafluoroethylene and perfluoroakyl vinyl ether.

4. A circuit substrate laminate for microwave frequency applications consisting essentially of:
    a core of one or more layers of fluoropolymer impregnated woven glass cloth having opposed first and second surfaces;
    one or more layers of a random microglass reinforced fluoropolymer adhered to said first surface of said core;
    one or more layers of a random microglass reinforced fluoropolymer adhered to said second surface of said core wherein said microglass reinforced fluoropolymer layers comprises a smooth outer surface opposite said core of fluoropolymer impregnated woven glass cloth; and
    conductive material on at least a portion of at least one of said smooth outer surfaces of said layers of microglass reinforced fluoropolymer; and
    wherein said fluoropolymer is at least one of the fluoropolymers selected from the group consisting of polytetrafluoroethylene and a copolymer of tetrafluoroethylene and perfluoroakyl vinyl ether.

5. A circuit substrate laminate for microwave frequency applications consisting essentially of:
    at least one first layer of a fluoropolymer impregnated woven glass cloth having opposed first and second surfaces;
    at least one second layer of a random microglass reinforced fluoropolymer on said first surface of said first layer of fluoropolymer impregnated woven glass cloth; and
    at least one third layer of a random microglass reinforced fluoropolymer on said second surface of said first layer of fluoropolymer impregnated woven glass cloth;

said second and third layers of random microglass reinforced fluoropolymer providing smooth outer surfaces to said circuit substrate laminate;

said circuit substrate laminate having a dissipation factor of between 0.00172 to 0.00092; and wherein said fluoropolymer is at least one of the fluoropolymers selected from the group consisting of polytetrafluoroethylene and a copolymer of tetrafluoroethylene and perfluoroakyl vinyl ether.

6. The laminate of claim 5 wherein each of said smooth outer surfaces of said second and third microglass reinforced fluoropolymer layers are opposite said at least one layer of fluoropolymer impregnated woven glass cloth and including:

conductive material on at least a portion of at least one of said smooth outer surfaces of said second and third layers of microglass reinforced fluoropolymer.

7. The laminate of claim 6 wherein:
said conductive material is copper.

8. The laminate of claim 6 wherein:
said conductive material is a resistive foil.

9. The laminate of claim 5 wherein:
said fluoropolymer impregnated woven glass cloth layer has about 30 to 85 weight percent of fluoropolymer.

10. The laminate of claim 5 wherein:
said at least one fluoropolymer impregnated woven glass cloth layer comprises about 10 to 60 percent of the total laminate thickness.

11. The laminate of claim 5 wherein said microglass is microfiberglass and wherein said microfiberglass has a length of less than 5000 micrometers and a diameter of between about 0.3 to 0.7 micrometers.

12. The laminate of claim 5 wherein:
each of said layers of microglass reinforced fluoropolymer comprises about 2 to 25 weight percent of microglass.

13. The laminate of claim 11 wherein:
each of said layers of microglass reinforced fluoropolymer comprises about 2 to 25 weight percent of microglass.

14. The laminate of claim 5 wherein:
said laminate has a total thickness of between about 0.003 to 0.500 inch.

15. The laminate of claim 6 including;
a fluoropolymeric bonding layer between said conductive material and said layer of microglass reinforced fluoropolymer.

16. A circuit laminate for microwave frequency applications consisting essentially of:

at least one first layer of a fluoropolymer impregnated woven glass cloth having opposed first and second surfaces;

at least one second layer of a random microglass reinforced fluoropolymer on said first surface of said first layer of fluoropolymer impregnated woven glass cloth;

at least one third layer of a random microglass reinforced fluoropolymer on said second surface of said first layer of fluoropolymer impregnated woven glass cloth wherein each of said second and third microglass reinforced fluoropolymer layers includes a smooth outer surface opposite said at least one layer of fluoropolymer impregnated woven glass cloth; and conductive material on at least a portion of at least one of said smooth outer surfaces of said second and third layers of microglass reinforced fluoropolymer;

said circuit substrate laminate having a dissipation factor of between 0.00172 to 0.00092; and wherein said fluoropolymer is at least one of the fluoropolymers selected from the group consisting of polytetrafluoroethylene and a copolymer of tetrafluoroethylene and perfluoroakyl vinyl ether.

17. The laminate of claim 16 wherein:
said conductive material is copper.

18. The laminate of claim 16 wherein:
said conductive material is a resistive foil.

19. The laminate of claim 16 wherein:
said fluoropolymer impregnated woven glass cloth layer has about 30 to 85 weight percent of fluoropolymer.

20. The laminate of claim 16 wherein:
said at least one fluoropolymer impregnated woven glass cloth layer comprises about 10 to 60 percent of the total laminate thickness.

21. The laminate of claim 16 wherein said microglass is microfiberglass and wherein said microfiberglass has a length of less than 5000 micrometers and a diameter of between about 0.3 to 0.7 micrometers.

22. The laminate of claim 16 wherein:
each of said layers of microglass reinforced fluoropolymer comprises about 2 to 25 weight percent of microglass.

23. The laminate of claim 20 wherein:
each of said layers of microglass reinforced fluoropolymer comprises about 2 to 25 weight percent of microglass.

24. The laminate of claim 16 wherein said first layer of fluoropolymer impregnated woven glass cloth and said first and second layers of microglass reinforced fluoropolymer define a laminate substrate and wherein:
said laminate substrate has a total thickness of between about 0.003 to 0.500 inch.

25. The laminate of claim 16 including:
a fluoropolymeric bonding layer between said conductive material and said layer of microglass reinforced fluoropolymer.

26. A circuit substrate laminate for microwave frequency applications consisting essentially of:

a core of one or more layers of fluoropolymer impregnated woven glass cloth having opposed first and second surfaces;

one or more layers of a random microglass reinforced fluoropolymer adhered to said first surface of said core;

one or more layers of a random microglass reinforced fluoropolymer adhered to said second surface of said core; and said layers of random microglass reinforced fluoropolymer providing smooth outer surfaces to said circuit substrate laminate;

said circuit substrate laminate having a dissipation factor of between 0.00172 to 0.00092; and wherein said fluoropolymer is at least one of the fluoropolymers selected from the group consisting of polytetrafluoroethylene and a copolymer of tetrafluoroethylene and perfluoroakyl vinyl ether.

27. The laminate of claim 26 including:
conductive material on at least a portion of at least one of said smooth outer surfaces of said layers of microglass reinforced fluoropolymer.

28. The laminate of claim 27 wherein:
said conductive material is copper.

29. The laminate of claim 27 wherein:
said conductive material is a resistive foil.

30. The laminate of claim 26 wherein:
said fluoropolymer impregnated woven glass cloth layer has about 30 to 85 weight percent of fluoropolymer.

31. The laminate of claim 26 wherein:
said at least one fluoropolymer impregnated woven glass cloth layer comprises about 10 to 60 percent of the total laminate thickness.

32. The laminate of claim 26 wherein said microglass is microfiberglass and wherein said microfiberglass has a length of less than 5000 micrometers and a diameter of between about 0.3 to 0.7 micrometers.

33. The laminate of claim 26 wherein:
each of said layers of microglass reinforced fluoropolymer comprises about 2 to 25 weight percent of microglass.

34. The laminate of claim 26 wherein:
said laminate has a total thickness of between about 0.003 to 0.500 inch.

35. The laminate of claim 27 including:
a fluoropolymeric bonding layer between said conductive material and said layer of microglass reinforced fluoropolymer.

36. A circuit substrate laminate for microwave frequency applications consisting essentially of:
a core of one or more layers of fluoropolymer impregnated woven glass cloth having opposed first and second surfaces;
one or more layers of a random microglass reinforced fluoropolymer adhered to said first surface of said core;
one or more layers of a random microglass reinforced fluoropolymer adhered to said second surface of said core wherein said microglass reinforced fluoropolymer layers comprises a smooth outer surface opposite said core of fluoropolymer impregnated woven glass cloth; and
conductive material on at least a portion of at least one of said smooth outer surfaces of said layers of microglass reinforced fluoropolymer;
said circuit substrate laminate having a dissipation factor of between 0.00172 to 0.00092; and
wherein said fluoropolymer is at least one of the fluoropolymers selected from the group consisting of polytetrafluorethylene and a copolymer of tetrafluoroethylene and perfluoroakyl vinyl ether.

37. The laminate of claim 36 wherein:
said conductive material is copper.

38. The laminate of claim 36 wherein:
said conductive material is a resistive foil.

39. The laminate of claim 36 wherein:
said fluoropolymer impregnated woven glass cloth layer has about 30 to 85 weight percent of fluoropolymer.

40. The laminate of claim 36 wherein:
said at least one fluoropolymer impregnated woven glass cloth layer comprises about 10 to 60 percent of the total laminate thickness.

41. The laminate of claim 36 wherein said microglass is microfiberglass and wherein said microfiberglass has a length of less than 5000 micrometers and a diameter of between about 0.3 to 0.7 micrometers.

42. The laminate of claim 36 wherein:
each of said layers of microglass reinforced fluoropolymer comprises about 2 to 25 weight percent of microglass.

43. The laminate of claim 36 wherein said core of fluoropolymer impregnated woven glass cloth and said layers of microglass reinforced fluoropolymer define a laminate substrate and wherein:
said laminate substrate has a total thickness of between about 0.003 to 0.500 inch.

44. The laminate of claim 36 including:
a fluoropolymeric bonding layer between said conductive material and said layer of microglass reinforced fluoropolymer.

* * * * *